US011769730B2

(12) United States Patent
Beak et al.

(10) Patent No.: US 11,769,730 B2
(45) Date of Patent: Sep. 26, 2023

(54) SEMICONDUCTOR DEVICE AND METHOD OF PROVIDING HIGH DENSITY COMPONENT SPACING

(71) Applicant: STATS ChipPAC Pte. Ltd., Singapore (SG)

(72) Inventors: WoonJae Beak, Incheon (KR); MinSu Kim, Incheon (KR); HeeSoo Lee, Kyunggi-do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 17/032,576

(22) Filed: Sep. 25, 2020

(65) Prior Publication Data
US 2021/0305168 A1 Sep. 30, 2021

Related U.S. Application Data

(60) Provisional application No. 63/001,241, filed on Mar. 27, 2020.

(51) Int. Cl.
*H01L 23/532* (2006.01)
*H01L 23/31* (2006.01)
*H01L 21/768* (2006.01)

(52) U.S. Cl.
CPC .. *H01L 23/53238* (2013.01); *H01L 21/76838* (2013.01); *H01L 23/31* (2013.01)

(58) Field of Classification Search
CPC ............... H01L 23/53238; H01L 23/31; H01L 21/76838
See application file for complete search history.

(56) References Cited

U.S. PATENT DOCUMENTS

| | | | | |
|---|---|---|---|---|
| 6,915,944 | B1* | 7/2005 | Takaya | B23K 35/3613 228/223 |
| 2007/0145101 | A1* | 6/2007 | Kataoka | H05K 3/3442 228/101 |
| 2007/0145575 | A1* | 6/2007 | Mori | H05K 1/023 257/723 |
| 2007/0170586 | A1* | 7/2007 | Lee | H01L 23/49866 257/737 |
| 2007/0259481 | A1* | 11/2007 | Chung | H01L 24/29 438/108 |

(Continued)

*Primary Examiner* — Peniel M Gumedzoe
(74) *Attorney, Agent, or Firm* — Robert D. Atkins; PATENT LAW GROUP: Atkins and Associates, P.C.

(57) ABSTRACT

A semiconductor device has a substrate and a first conductive layer formed over the substrate. A second conductive layer is formed over the first conductive layer. The first conductive layer can be copper, and the second conductive layer can be nickel. A thickness of the second conductive layer is greater than a thickness of the first conductive layer. A flux material is deposited over the second conductive layer by a printing process. An electrical component is disposed over the flux material, and the flux material is reflowed to make electrical connection between the electrical component and second conductive layer. The flux material substantially vaporizes during the reflow to reduce the occurrence of short circuits. The electrical components can be placed over the substrate with narrow spacing and higher density given the use of the flux material to make electrical connection. An encapsulant is deposited over the electrical component.

25 Claims, 6 Drawing Sheets

(56) References Cited

U.S. PATENT DOCUMENTS

| | | | |
|---|---|---|---|
| 2010/0105173 A1* | 4/2010 | Fujimori | H01L 24/12 257/E21.511 |
| 2014/0252593 A1* | 9/2014 | Chen | H01L 21/56 257/737 |
| 2014/0264846 A1* | 9/2014 | Chen | H01L 25/50 257/737 |
| 2014/0339289 A1* | 11/2014 | Ootorii | H01L 24/95 228/176 |
| 2015/0333027 A1* | 11/2015 | Sekimoto | H01L 21/48 228/248.1 |
| 2017/0125375 A1* | 5/2017 | Chinnusamy | H01L 24/13 |
| 2019/0123014 A1* | 4/2019 | Honda | H01L 24/29 |

* cited by examiner

SEMICONDUCTOR DEVICE AND METHOD OF PROVIDING HIGH DENSITY COMPONENT SPACING

CLAIM TO DOMESTIC PRIORITY

The present application claims the benefit of U.S. Provisional Application No. 63/001,241, filed Mar. 27, 2020, which application is incorporated herein by reference.

FIELD OF THE INVENTION

The present invention relates in general to semiconductor devices and, more particularly, to a semiconductor device and method of providing high density electrical components with narrow spacing by making electrical connection with flux material on a system-in-package (SIP).

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor packages are commonly made with several active semiconductor components, discrete passive components, and integrated passive devices (IPDs) disposed together into a single-package system, also known as a system-in-package (SiP). The SiP offers higher density and enhanced electrical functionality relative to traditional semiconductor packaging.

Within the SiP, multiple active and passive electrical components are mounted to a substrate for structural support and electrical interconnect. Solder paste is deposited on contact pads of the substrate and the solder paste is reflowed to make electrical connection between the electrical components and substrate. The solder paste tends to leak out during reflow, which can cause defects by making unintended electrical connection to adjacent electrical components. To avoid electrical short circuits, the electrical components are spaced apart beyond the leak out range. The greater spacing requirement decreases the layout density of the electrical components, i.e., fewer electrical components per unit area to avoid short circuits.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
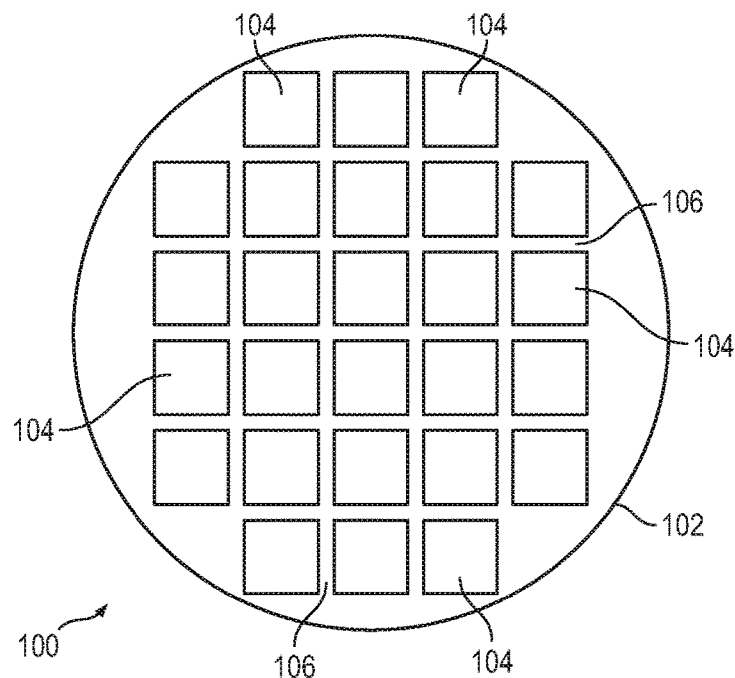
FIGS. 1a-1b illustrate a semiconductor wafer with a plurality of semiconductor die.

FIG. 1a shows a semiconductor wafer or substrate 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
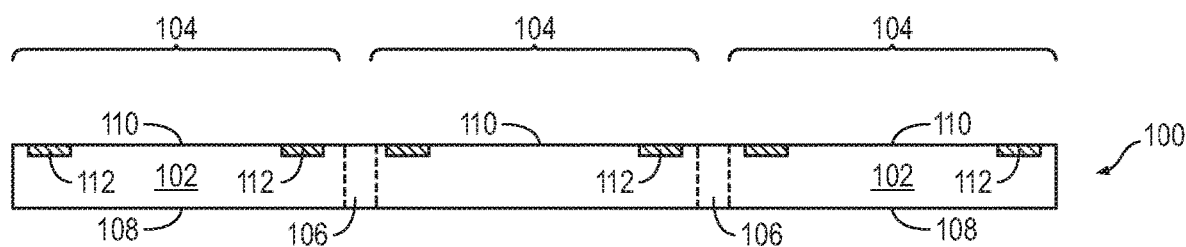

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Figure 2A:
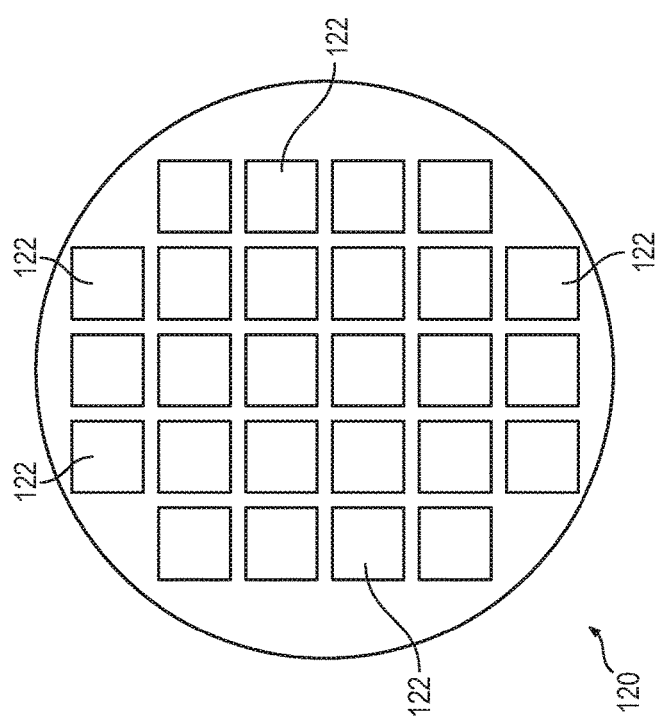
FIGS. 2a-2b illustrate an electrical interconnect substrate with a plurality of component attach areas.

FIG. 2a shows a semiconductor wafer or substrate 120 including an internal electrical interconnect structure. Component attach areas 122 provide locations to attach semiconductor die 104 or other electrical components to construct the SIP.

Figure 2B:
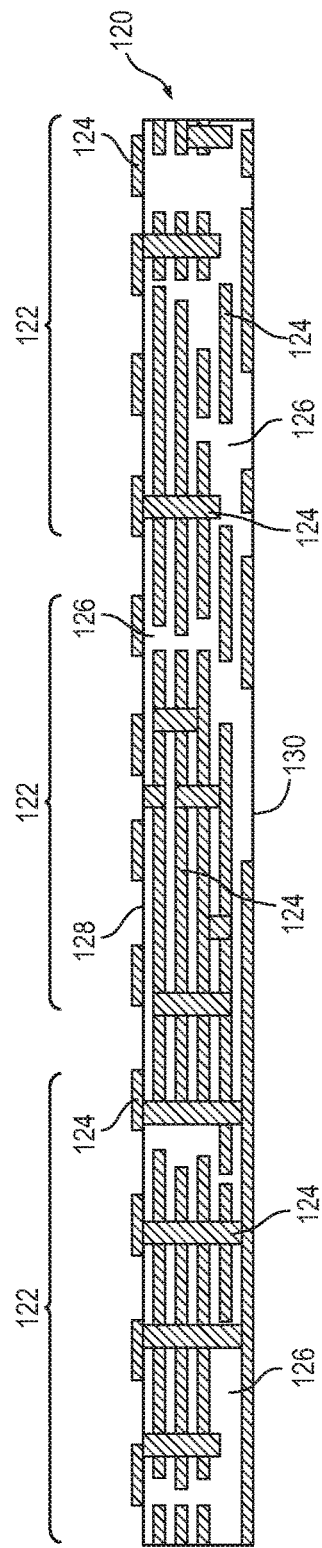

FIG. 2b shows a cross-sectional view of a portion of semiconductor wafer 120 including conductive layers 124 and insulating layer 126. Conductive layer 124 can be one or more layers of Al, Cu, Sn, Ni, Au, Ag, or other suitable electrically conductive material. Conductive layer 124 provides horizontal electrical interconnect across substrate 120 and vertical electrical interconnect between surface 128 and surface 130 of substrate 120. Portions of conductive layer 124 can be electrically common or electrically isolated depending on the design and function of semiconductor die 104 or other electrical components. Insulating layer 126 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), solder resist, polyimide, benzocyclobutene (BCB), polybenzoxazoles (PBO), and other material having similar insulating and structural properties. Insulating layer 126 provides isolation between conductive layers 124.

Figure 3A:
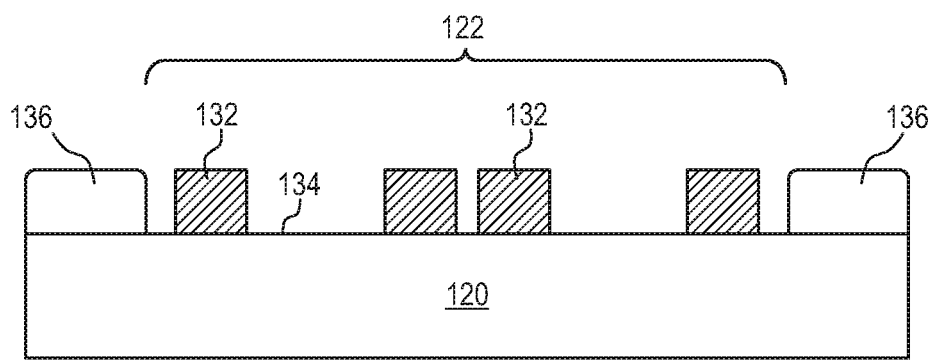
FIGS. 3a-3f illustrate a process of providing higher density electrical components with narrow spacing between the electrical components.

FIGS. 3a-3f illustrate a process of providing higher density electrical components with narrow spacing on an SIP. FIG. 3a shows a cross-sectional view of a portion of substrate 120, although substrate 100 can also be used. Conductive layer 132 is formed over surface 134 of substrate 120 using PVD, CVD, electrolytic plating, electroless plating process, or other suitable metal deposition process. Conductive layer 132 can be one or more layers of Al, Cu, Sn, Ni, Au, Ag, or other suitable electrically conductive material. In one embodiment, conductive layer 132 includes Cu pads. Conductive layer 132 is formed with component attach area 122 within boundaries of insulating material or solder resist 136 and patterned as contact pads and electrically connected to conductive layer 124 within substrate 120.

Figure 3B:
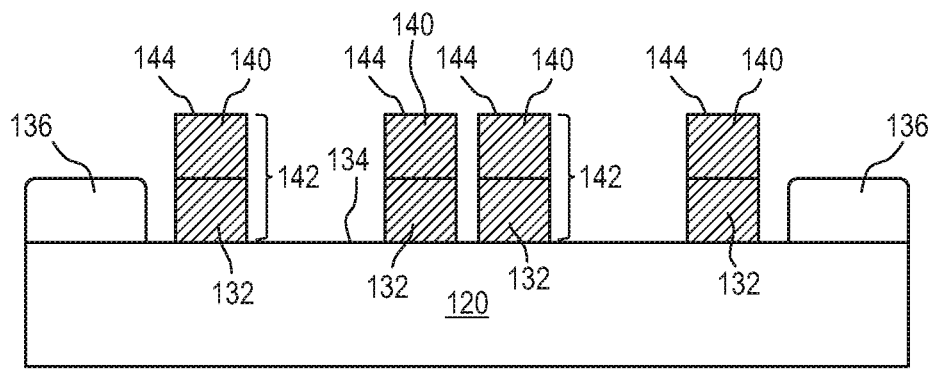

In FIG. 3b, conductive layer 140 is formed over conductive layer 132 using PVD, CVD, electrolytic plating, electroless plating process, or other suitable metal deposition process. Conductive layer 140 can be one or more layers of Al, Cu, Sn, Ni, Au, Ag, or other suitable electrically conductive material. In one embodiment, conductive layer 140 is Ni and extends above solder resist 136. The combination of conductive layers 132-140 operate as multi-layered conductive post 142 on substrate 120. The thickness of conductive layer 140 is 2-15 μm, and the thickness of conductive layer 132 is 10-15 μm.

Figure 3C:
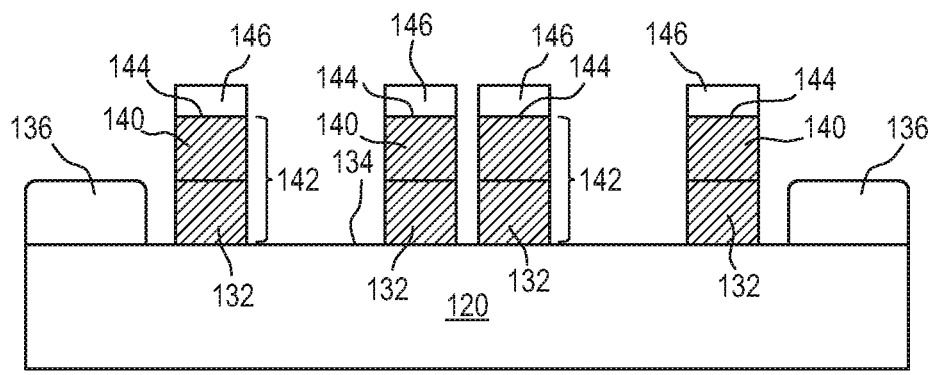

In FIG. 3c, a flux material 146 is deposited over surface 144 of conductive layer 140, notably without solder on conductive layer 140. In one embodiment, flux material 146 is a flux print material is applied using a printing process.

Figure 3D:
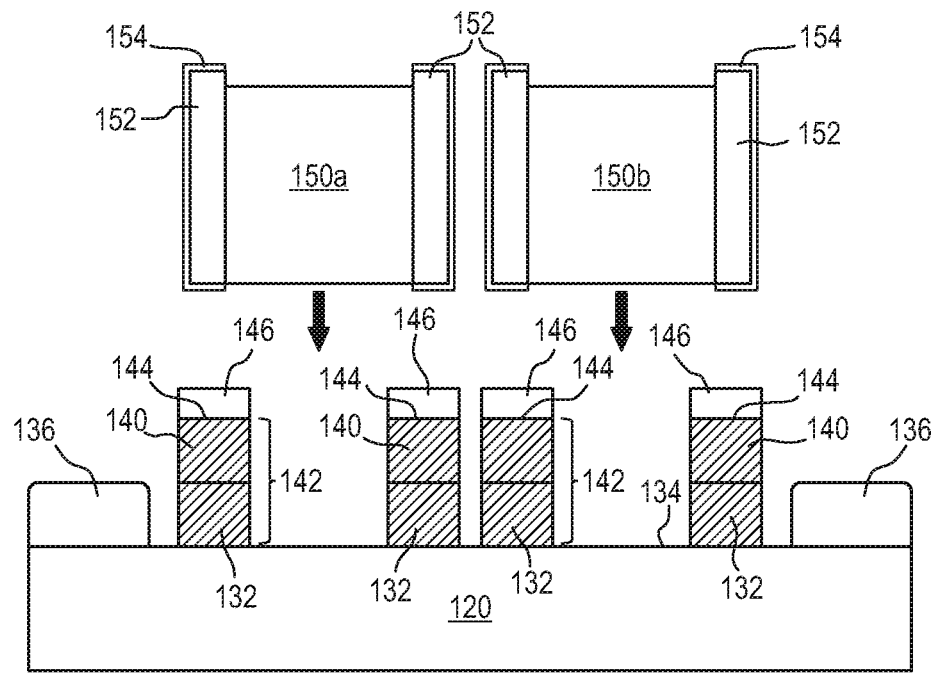

In FIG. 3d, pre-solder material 154 is applied to contact terminals 152 of electrical elements 150. Pre-solder material 154 adheres to contact terminals 152 and is solidified prior to mounting to conductive post 142. Electrical component 150 is then positioned over component attach area 122 using a pick and place operation with contact terminals 152 aligned with conductive posts 142. Electrical component 150 can be a discrete electrical device or IPD, such as a resistor, capacitor, and inductor. Alternatively, electrical component 150 can be semiconductor die 104 from FIG. 1b, or semiconductor package, or other surface mount semiconductor device.

Figure 3E:
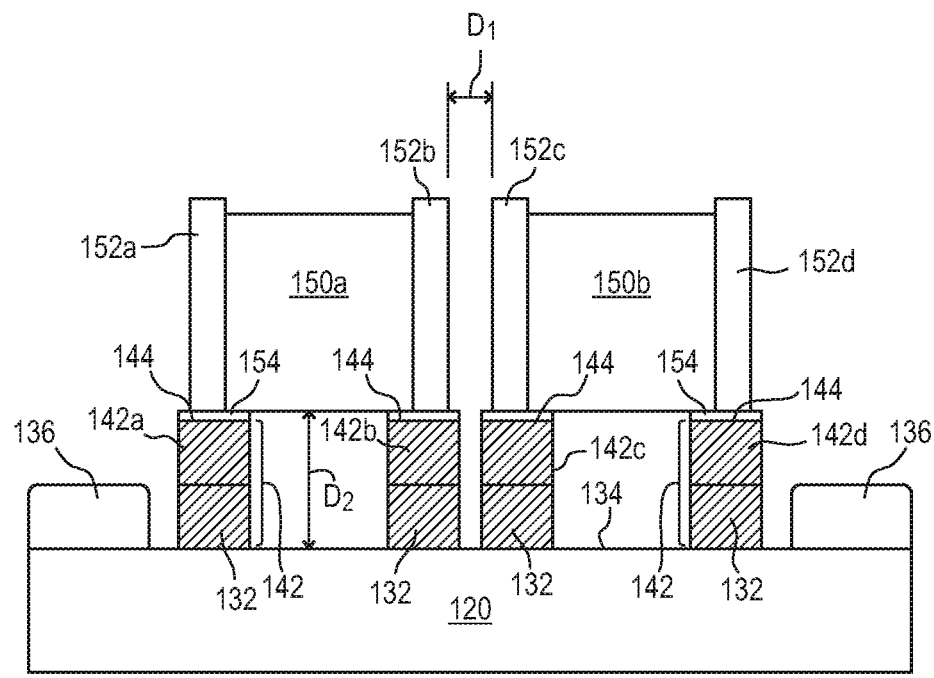

FIG. 3e shows electrical component 150 mounted to flux material 146 on conductive posts 142. Contact terminal 152a of electrical component 150a with pre-solder material 154 contacts flux material 146 over conductive post 142a. Contact terminal 152b of electrical component 150a with pre-solder material 154 contacts flux material 146 over conductive post 142b. Contact terminal 152c of electrical component 150b with pre-solder material 154 contacts flux material 146 over conductive post 142c. Contact terminal 152d of electrical component 150b with pre-solder material 154 contacts flux material 146 over conductive post 142d. During reflow, pre-solder material 154 is melted leaving electrical component 150 electrically and mechanically attached to conductive post 142. Flux material 146 substantially volatizes or vaporizes during the reflow process. Flux material 146 and pre-solder material 154 holds electrical components 150 to conductive posts 142 sufficient to prevent excessive movement. The liquid state of pre-solder material 154 induces electrical component 150 to self-align with conductive posts 142.

With little or no movement of electrical components 150 and flux material volatizing or vaporizing during reflow, there is little or no risk of leak of material that could cause a short circuit. According, the spacing D1 between adjacent electrical components 150a and 150b can be reduced, e.g., less than 50 micrometers (μm). The narrow spacing provides higher density electrical components per unit area. The space D2 between electrical component 150 and surface 134 can be adjusted by the thickness of conductive layer 132 and/or conductive layer 140. A higher spacing D2 increases the flow of encapsulant 160 and reduces voids between electrical components 150.

Figure 3F:
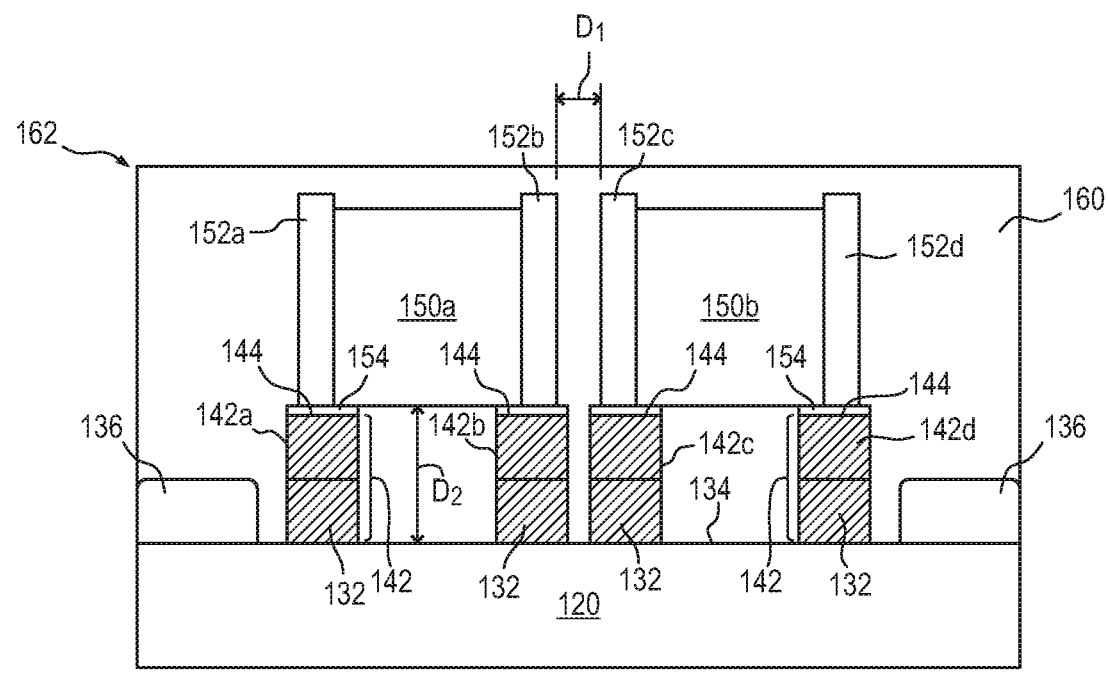

In FIG. 3f, an encapsulant or molding compound 160 is deposited around and under electrical components 150 and conductive posts 142 using a paste printing, compressive molding, transfer molding, liquid encapsulant molding, vacuum lamination, spin coating, or other suitable applicator. Encapsulant 160 can be polymer composite material, such as epoxy resin, epoxy acrylate, or polymer with or without a proper filler. Encapsulant 160 is non-conductive, provides structural support, and environmentally protects the semiconductor device from external elements and contaminants.

SIP 162 provides a higher density of electrical components 150 by nature of depositing flux material on conductive posts 142, made from multiple layers of Cu and Ni. Flux material 146 holds electrical components 150 to conductive posts 142 during reflow so the electrical components can have narrow spacing for higher density. Making electrical connection with flux material 146 and pre-solder material 154 reduces or eliminates the use of solder paste. During reflow, pre-solder material 154 is melted leaving electrical component 150 electrically and mechanically attached to conductive post 142. Flux material 146 substantially vaporizes during reflow, which reduces the opportunity for defects from a short circuit condition. With little or no movement of electrical components 150 and flux material vaporizing during reflow, there is little or no risk of leak of material that could cause a short circuit. According, the spacing D1 between adjacent electrical components 150*a* and 150*b* can be reduced, which provides higher density electrical components per unit area. SIP 162 involves lower process cost with less tooling and material, as flux printing is a low cost operation.

Figure 4:
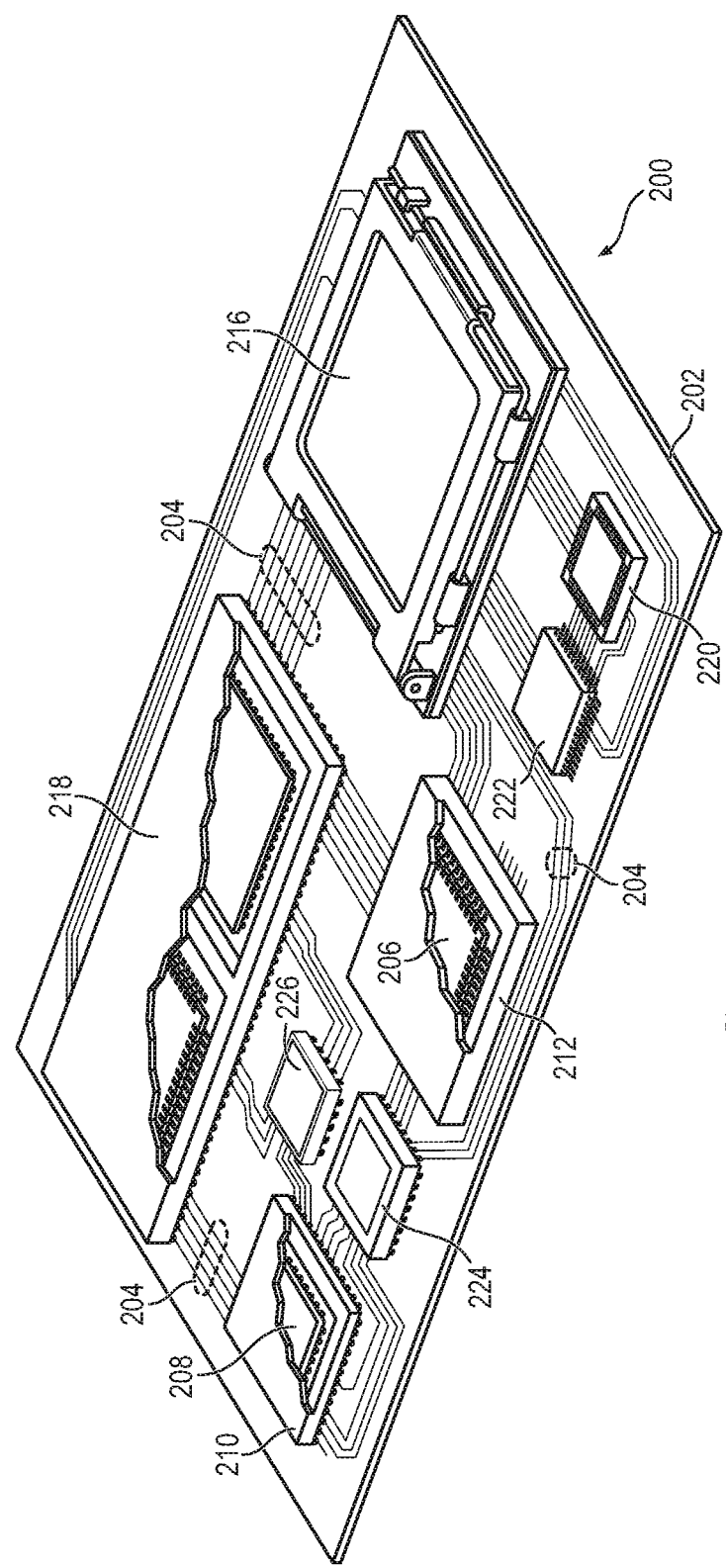
FIG. 4 illustrates a printed circuit board (PCB) with different types of packages mounted to a surface of the PCB.

FIG. 4 illustrates electronic device 200 having a chip carrier substrate or PCB 202 with a plurality of semiconductor packages mounted on a surface of PCB 202, including SIP module 180. Electronic device 200 can have one type of semiconductor package, or multiple types of semiconductor packages, depending on the application.

Electronic device 200 can be a stand-alone system that uses the semiconductor packages to perform one or more electrical functions. Alternatively, electronic device 200 can be a subcomponent of a larger system. For example, electronic device 200 can be part of a tablet, cellular phone, digital camera, communication system, or other electronic device. Alternatively, electronic device 200 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 4, PCB 202 provides a general substrate for structural support and electrical interconnect of the semiconductor packages mounted on the PCB. Conductive signal traces 204 are formed over a surface or within layers of PCB 202 using evaporation, electrolytic plating, electroless plating, screen printing, or other suitable metal deposition process. Signal traces 204 provide for electrical communication between each of the semiconductor packages, mounted components, and other external system components. Traces 204 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 206 and flipchip 208, are shown on PCB 202. Additionally, several types of second level packaging, including ball grid array (BGA) 210, bump chip carrier (BCC) 212, land grid array (LGA) 216, multi-chip module (MCM) 218, quad flat non-leaded package (QFN) 220, quad flat package 222, embedded wafer level ball grid array (eWLB) 224, and wafer level chip scale package (WLCSP) 226 are shown mounted on PCB 202. In one embodiment, eWLB 224 is a fan-out wafer level package (Fo-WLP) and WLCSP 226 is a fan-in wafer level package (Fi-WLP). Depending upon the system requirements, any combination of semiconductor packages, configured with any combination of first and second level packaging styles, as well as other electronic components, can be connected to PCB 202. In some embodiments, electronic device 200 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   forming a first conductive post over the substrate;
   forming a second conductive post over the substrate;
   forming a third conductive post over the substrate;
   forming a fourth conductive post over the substrate;
   depositing a flux material in contact with a top surface of the first conductive post, second conductive post, third conductive post, and fourth conductive post, wherein the flux material is laterally limited within a footprint of the top surface of the first conductive post, second conductive post, third conductive post, and fourth conductive post;
   disposing a first electrical component over the flux material on the first conductive post and second conductive post;
   disposing a second electrical component over the flux material on the third conductive post and fourth conductive post with a spacing between the first electrical component and second electrical component being less than 50 micrometers; and
   reflowing the flux material to make electrical connection between the first electrical component and the first conductive post and second conductive post and further to make electrical connection between the second electrical component and the third conductive post and fourth conductive post, wherein the flux material maintains positions of the first electrical component and second electrical component during reflowing to avoid contact between the first electrical component and second electrical component.

2. The method of claim 1, further including depositing the flux material by a printing process.

3. The method of claim 1, further including:
   disposing a pre-solder material on a contact pad of the first electrical component and on a contact pad of the second electrical component; and
   bringing the pre-solder material in contact with the flux material when disposing the first electrical component and second electrical component over the flux material.

4. The method of claim 1, further including:
   forming the first conductive post including a first portion of a first conductive layer formed over the substrate and a first portion of a second conductive layer formed over the first portion of the first conductive layer;
   forming the second conductive post including a second portion of the first conductive layer formed over the substrate and a second portion of the second conductive layer formed over the second portion of the first conductive layer;
   forming the third conductive post including a third portion of the first conductive layer formed over the substrate and a third portion of the second conductive layer formed over the third portion of the first conductive layer; and forming the fourth conductive post including a fourth portion of the first conductive layer formed over the substrate and a fourth portion of the second conductive layer formed over the fourth portion of the first conductive layer.

5. The method of claim 4, wherein a thickness of the second conductive layer is greater than a thickness of the first conductive layer.

6. The method of claim 1, further including depositing an encapsulant over the first electrical component and second electrical component.

7. A method of making a semiconductor device, comprising:
providing a substrate;
forming a first conductive post over the substrate;
forming a second conductive post over the substrate;
forming a third conductive post over the substrate;
forming a fourth conductive post over the substrate;
depositing a flux material over a top surface of the first conductive post, second conductive post, third conductive post, and fourth conductive post;
disposing a first electrical component over the flux material on the first conductive post and second conductive post;
disposing a second electrical component over the flux material on the third conductive post and fourth conductive post less than 50 micrometers from the first electrical component; and
reflowing the flux material to make electrical connection between the first electrical component and the first conductive post and second conductive post and further to make electrical connection between the second electrical component and the third conductive post and fourth conductive post while avoiding contact between the first electrical component and second electrical component.

8. The method of claim 7, further including depositing the flux material by a printing process.

9. The method of claim 7, further including:
disposing a pre-solder material on a contact pad of the first electrical component and on a contact pad of the second electrical component; and
bringing the pre-solder material in contact with the flux material when disposing the first electrical component and second electrical component over the flux material.

10. The method of claim 7, further including:
forming the first conductive post including a first portion of a first conductive layer formed over the substrate and a first portion of a second conductive layer formed over the first portion of the first conductive layer;
forming the second conductive post including a second portion of the first conductive layer formed over the substrate and a second portion of the second conductive layer formed over the second portion of the first conductive layer;
forming the third conductive post including a third portion of the first conductive layer formed over the substrate and a third portion of the second conductive layer formed over the third portion of the first conductive layer; and
forming the fourth conductive post including a fourth portion of the first conductive layer formed over the substrate and a fourth portion of the second conductive layer formed over the fourth portion of the first conductive layer.

11. The method of claim 10, wherein a thickness of the second conductive layer is greater than a thickness of the first conductive layer.

12. The method of claim 10, wherein the second conductive layer includes nickel or copper.

13. The method of claim 7, further including depositing an encapsulant over the first electrical component and second electrical component.

14. A semiconductor device, comprising:
a substrate;
a first conductive post formed over the substrate;
a second conductive post formed over the substrate;
a third conductive post formed over the substrate;
a fourth conductive post formed over the substrate;
a flux material deposited in contact with a top surface of the first conductive post, second conductive post, third conductive post, and fourth conductive post;
a first electrical component disposed over the flux material on the first conductive post and second conductive post; and
a second electrical component disposed over the flux material on the third conductive post and fourth conductive post with a spacing between the first electrical component and second electrical component being less than 50 micrometers, wherein the flux material maintains position of the first electrical component and second electrical component to avoid contact between the first electrical component and second electrical component.

15. The semiconductor device of claim 14, wherein the flux material includes a flux print material.

16. The semiconductor device of claim 14, further including a pre-solder material disposed on a contact pad of the first electrical component and on a contact pad of the second electrical component, wherein the pre-solder material contacts the flux material with the first electrical component and second electrical component disposed over the flux material.

17. The semiconductor device of claim 14, wherein:
the first conductive post includes a first portion of a first conductive layer formed over the substrate and a first portion of a second conductive layer formed over the first portion of the first conductive layer;
the second conductive post includes a second portion of the first conductive layer formed over the substrate and a second portion of the second conductive layer formed over the second portion of the first conductive layer;
the third conductive post includes a third portion of the first conductive layer formed over the substrate and a third portion of the second conductive layer formed over the third portion of the first conductive layer; and
the fourth conductive post includes a fourth portion of the first conductive layer formed over the substrate and a fourth portion of the second conductive layer formed over the fourth portion of the first conductive layer.

18. The semiconductor device of claim 17, wherein a thickness of the second conductive layer is greater than a thickness of the first conductive layer.

19. The semiconductor device of claim 14, further including an encapsulant deposited over the first electrical component and second electrical component.

20. A semiconductor device, comprising:
a substrate;
a first conductive post formed over the substrate;
a second conductive post formed over the substrate;

a third conductive post formed over the substrate;

a fourth conductive post formed over the substrate;

a flux material deposited over a top surface of the first conductive post, second conductive post, third conductive post, and fourth conductive post;

a first electrical component disposed over the flux material on the first conductive post and second conductive post; and a second electrical component disposed over the flux material on the third conductive post and fourth conductive post less than 50 micrometers from the first electrical component, wherein the flux material maintains position of the first electrical component and second electrical component to avoid contact between the first electrical component and second electrical component.

21. The semiconductor device of claim 20, wherein the flux material includes a flux print material.

22. The semiconductor device of claim 20, further including a pre-solder material disposed on a contact pad of the first electrical component and on a contact pad of the second electrical component, wherein the pre-solder material contacts the flux material with the first electrical component and second electrical component disposed over the flux material.

23. The semiconductor device of claim 20, wherein:

the first conductive post includes a first portion of a first conductive layer formed over the substrate and a first portion of a second conductive layer formed over the first portion of the first conductive layer;

the second conductive post includes a second portion of the first conductive layer formed over the substrate and a second portion of the second conductive layer formed over the second portion of the first conductive layer;

the third conductive post includes a third portion of the first conductive layer formed over the substrate and a third portion of the second conductive layer formed over the third portion of the first conductive layer; and the fourth conductive post includes a fourth portion of the first conductive layer formed over the substrate and a fourth portion of the second conductive layer formed over the fourth portion of the first conductive layer.

24. The semiconductor device of claim 23, wherein a thickness of the second conductive layer is greater than a thickness of the first conductive layer.

25. The semiconductor device of claim 20, further including an encapsulant deposited over the first electrical component and second electrical component.

* * * * *